(12) United States Patent
Murai et al.

(10) Patent No.: US 7,479,728 B2
(45) Date of Patent: Jan. 20, 2009

(54) PIEZOELECTRIC ELEMENT, METHOD OF MANUFACTURING THE SAME, LIQUID-JET HEAD, METHOD OF MANUFACTURING THE SAME, AND LIQUID-JET APPARATUS

(75) Inventors: Masami Murai, Nagano-ken (JP);
Xin-Shan Li, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 246 days.

(21) Appl. No.: 11/365,854

(22) Filed: Mar. 2, 2006

(65) Prior Publication Data
US 2006/0208618 A1    Sep. 21, 2006

(30) Foreign Application Priority Data
Mar. 2, 2005    (JP)    ............................. 2005-058218

(51) Int. Cl.
    *B41J 2/45*    (2006.01)
(52) U.S. Cl. ........................... 310/363; 347/68; 347/70; 347/71
(58) Field of Classification Search ................. 310/328, 310/363–366, 324; 347/68–71
See application file for complete search history.

(56) References Cited

U.S. PATENT DOCUMENTS

| | | | | |
|---|---|---|---|---|
| 6,903,491 | B2 * | 6/2005 | Irie et al. ..................... | 310/328 |
| 2002/0180843 | A1 * | 12/2002 | Irie et al. ....................... | 347/70 |
| 2003/0189241 | A1 * | 10/2003 | Kamada et al. ............. | 257/632 |
| 2004/0104981 | A1 * | 6/2004 | Fujii et al. ..................... | 347/71 |
| 2005/0218756 | A1 * | 10/2005 | Fujii et al. .................... | 310/358 |
| 2006/0146097 | A1 * | 7/2006 | Fujii et al. ..................... | 347/68 |
| 2006/0208618 | A1 * | 9/2006 | Murai et al. ................. | 310/363 |

FOREIGN PATENT DOCUMENTS

| | | |
|---|---|---|
| JP | 2001-298219 A | 10/2001 |
| JP | 3517876 B2 | 2/2004 |
| JP | 2004-186646 A | 7/2004 |
| JP | 2004-265900 A | 9/2004 |

* cited by examiner

*Primary Examiner*—Jaydi A San Martin
(74) *Attorney, Agent, or Firm*—Sughrue Mion, PLLC

(57) ABSTRACT

The present invention is to provide a piezoelectric element, a method of manufacturing the same, a liquid-jet head, a method of manufacturing the same, and a liquid-jet apparatus, all of which prevent an inter-layer detachment in a lower electrode. A method of manufacturing a piezoelectric element, comprising the steps of: forming, on a substrate, a lower electrode configured of a plurality of layers which includes a metal layer with a limit thickness of 20 nm at least in its uppermost layer, the metal layer essentially containing iridium; forming a multi-layered piezoelectric layers by means of performing a piezoelectric film forming step a plurality times, the piezoelectric film forming step including an applying step of applying a piezoelectric precursor film onto the lower electrode, a drying step of drying the piezoelectric precursor film which has been applied thereon through the applying step, a degreasing step of degreasing the piezoelectric precursor film which has been dried through the drying step, and a baking step of making the piezoelectric precursor film, which has been degreased through the degreasing step, into a piezoelectric film by baking and crystallizing the piezoelectric precursor film; and forming an upper electrode on the piezoelectric layer.

3 Claims, 9 Drawing Sheets

PIEZOELECTRIC ELEMENT, METHOD OF MANUFACTURING THE SAME, LIQUID-JET HEAD, METHOD OF MANUFACTURING THE SAME, AND LIQUID-JET APPARATUS

BACKGROUND OF THE INVENTION

1. Field of the Invention

The present invention relates to a piezoelectric element configured of a lower electrode, piezoelectric layers and upper electrodes as well as a method of manufacturing the piezoelectric element. Specifically, the present invention relates to a liquid-jet head which ejects droplets from nozzle orifices, and a method of manufacturing the liquid-jet head as well as a piezoelectric element used for a liquid-jet apparatus.

2. Description of the Prior Art

An inkjet recording head with the following configuration has been put into practical use. In accordance with the configuration, a part of pressure generating chambers communicating with nozzle orifices from which ink droplets are ejected is constructed with a vibration plate. The vibration plate is deformed by piezoelectric elements, and thus ink in each of the pressure generating chambers is pressurized. Accordingly, ink droplets are ejected from each of the nozzle orifices.

An inkjet recording head which is constructed, for example, in the following manner is among such inkjet recording heads. An even layer made of a piezoelectric material is formed on the entire surface of the vibration plate by use of a film-forming technique. Then, this layer made of the piezoelectric material is cut into shapes corresponding to the pressure generating chambers by the lithography method. Thereby, the piezoelectric elements are formed in order that the piezoelectric elements respectively in the pressure generating chambers can be independent from one anther.

A piezoelectric element having a piezoelectric layer which is formed in the following manner has been proposed as such a piezoelectric element used for the inkjet recording heads. First, an iridium layer made of iridium (Ir), a platinum layer made of platinum (Pr) and an iridium layer made of iridium (Ir) are sequentially laminated over one another by use of an adhesion layer including titanium (Ti) provided on top of the zirconia ($ZrO_2$), and thus the lower electrode film is formed. Then, the piezoelectric layer is formed on top of this lower electrode film by the sol-gel method. (See pp. 9-10 and FIG. 3 of Japanese Patent Official Gazette No. 3517876, for example)

Such a piezoelectric layer is formed with a predetermined thickness by means of repeatedly laminating a plurality of piezoelectric films over one another, each of piezoelectric films being made of a thin film. However, the lower electrode film is also heated at the same time as the piezoelectric films are heated while the piezoelectric films are being formed. As a result, iridium is thermally oxidized, and thus an iridium oxide film made of the iridium oxide ($IrO_2$) is formed, in a part of the lower electrode, the part being closest to the piezoelectric films. When such an iridium oxide layer is formed, it is likely that a stress may be concentrated between the iridium oxide layer and a mixed film made of an alloy of the iridium, the platinum and the titanium, and that an inter-layer detachment may occur in the lower electrode film. Such an inter-layer detachment in the lower electrode film obviously appears in a case where a plurality of laminated piezoelectric films are formed.

It should be noted that, such problems are not limited to liquid-jet heads represented by inkjet recording heads and methods of manufacturing the liquid-jet heads. The problems are similarly present in piezoelectric elements and methods of manufacturing the piezoelectric elements.

SUMMARY OF THE INVENTION

With the aforementioned conditions taken into consideration, an object of the present invention is to provide a piezoelectric element, a method of manufacturing the same, a liquid-jet head, a method of manufacturing the same, and a liquid-jet apparatus, all of which prevent an inter-layer detachment in a lower electrode.

A first aspect of the present invention for the purpose of solving the aforementioned problems is a method of manufacturing a piezoelectric element, which is characterized by including the steps of:

forming, on a substrate, a lower electrode configured of a plurality of layers which includes a metal layer with a thickness limit of 20 nm at least in its uppermost layer, the metal layer essentially containing iridium;

forming a multi-layered piezoelectric layers by means of performing a piezoelectric film forming step a plurality times, the piezoelectric film forming step including an applying step of applying a piezoelectric precursor film onto the lower electrode, a drying step of drying the piezoelectric precursor film which has been applied thereon through the applying step, a degreasing step of degreasing the piezoelectric precursor film which has been dried through the drying step, and a baking step of making the piezoelectric precursor film, which has been degreased through the degreasing step, into a piezoelectric film by baking and crystallizing the piezoelectric precursor film; and forming an upper electrode on the piezoelectric layer.

In the case of the first aspect, the provision of the metal layer with the predetermined thickness to the uppermost layer of the lower electrode makes it possible to prevent an inter-layer detachment in the lower electrode, even though the lower electrode is thermally processed at the same time as the piezoelectric layer is formed by the baking process.

A second aspect of the present invention is the method of manufacturing a piezoelectric element according to the first aspect, which is characterized in that, in the lower-electrode forming step, an iridium layer made of iridium, a platinum layer made of platinum and the metal layer are formed by laminating the layers over one another on the substrate.

In the case of the second aspect, it is possible to prevent an inter-layer detachment in the lower electrode obtained particularly by laminating the iridium layer, the platinum layer and the metal layer over one another.

A third aspect of the present invention is the method of manufacturing a piezoelectric element according to any one of the first and the second aspects, which is characterized in that each of the layers constituting the lower electrode is formed by a sputtering method, and in that the layers are formed continuously by laminating the layers over one another without releasing the layers from the vacuum.

In the case of the third aspect, the continuous formation of the layers of the lower electrode without releasing the layers from the vacuum makes it possible to securely prevent detachment between each of the two neighboring layers constituting the lower electrode.

A fourth aspect of the present invention is the method of manufacturing a piezoelectric element according to any one of the first and the third aspects, which is characterized in that a seed layer containing titanium is formed on the metal layer.

In the case of the fourth aspect, it is possible to turn the piezoelectric film into a satisfactory crystalline condition by means of assisting crystallization of the piezoelectric film while the piezoelectric precursor film is being made into the piezoelectric film by baking and crystallizing.

A fifth aspect of the present invention is a method of manufacturing a liquid-jet head, which is characterized in that a liquid-jet head is manufactured by use of the method of manufacturing a piezoelectric element according to any one of the first and the fourth aspects.

In the case of the fifth aspect, it is possible to increase yields and cut costs, and to concurrently manufacture the liquid-jet head whose reliability is improved.

A sixth aspect of the present invention is a piezoelectric element characterized by including a lower electrode, a piezoelectric layer and an upper electrode, the piezoelectric element characterized in that at least a part of the lower electrode, which part is closest to the piezoelectric layer, is an iridium oxide layer, which essentially contains iridium oxide, and whose thickness limit is 50 nm, by means of thermally processing a metal layer, which essentially contains iridium, and whose thickness limit is 20 nm.

In the case of the sixth aspect, the provision of the metal layer with the predetermined thickness to the uppermost layer of the lower electrode makes it possible to prevent an interlayer detachment in the lower electrode.

A seventh aspect of the present invention is a liquid-jet head characterized by including the piezoelectric element according to the sixth aspect and a passage-forming substrate, to which the piezoelectric element is provided with a vibration plate interposed in between, and to which a pressure generating chamber communicating with a nozzle orifice is provided.

In the case of the seventh aspect, it is possible to increase yields and cut costs, and to concurrently manufacture the liquid-jet head whose reliability is improved.

An eighth aspect of the present invention is a liquid-jet apparatus characterizing by including the liquid-jet head according to the seventh aspect.

In the case of the eighth aspect, it is possible to increase yields and cut costs, and to concurrently manufacture the liquid-jet head whose reliability is improved.

DESCRIPTION OF THE PREFERRED EMBODIMENTS

Hereinafter, detailed descriptions will be provided for the present invention on a basis of embodiments.

First Embodiment

Figure 1:
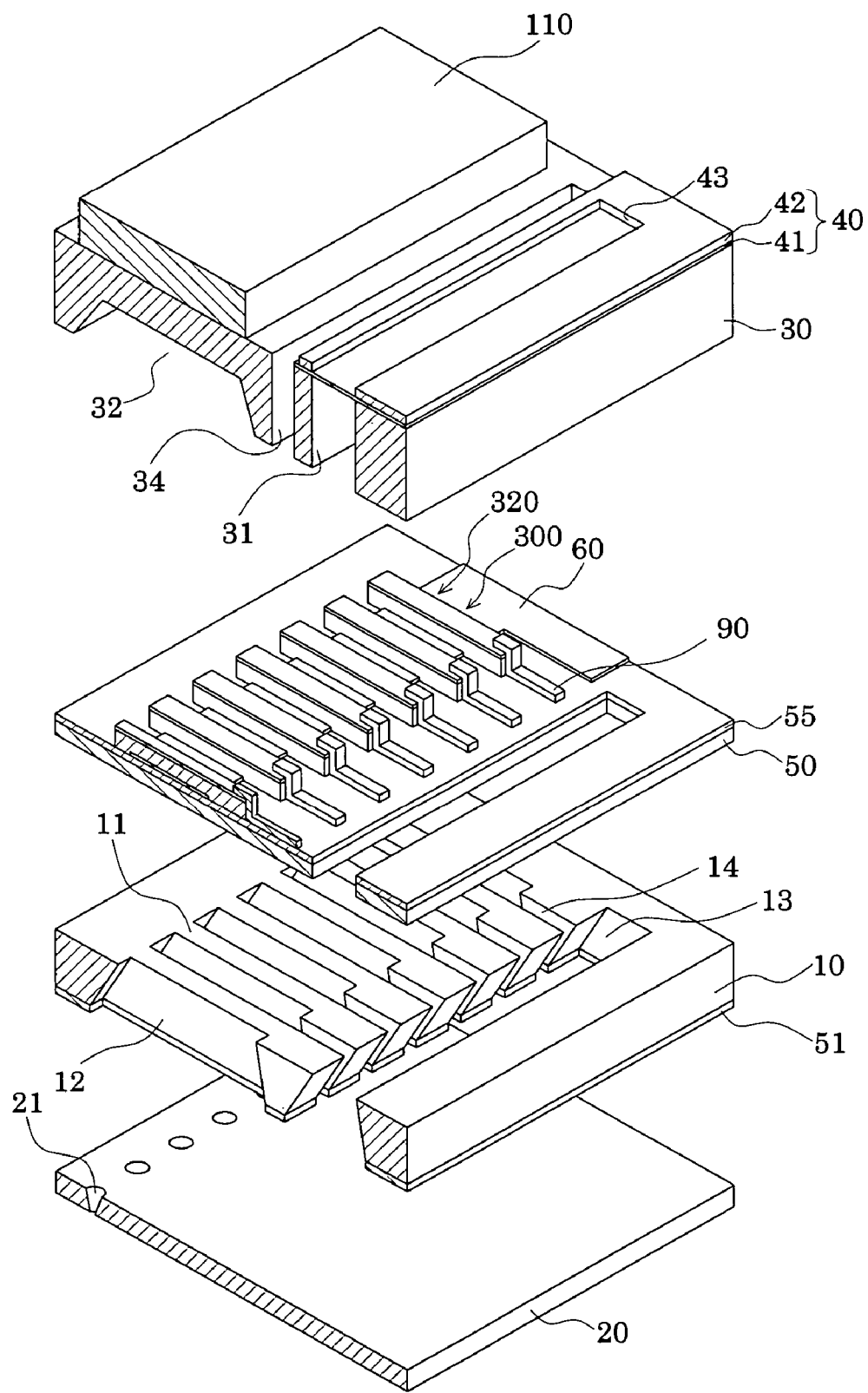
FIG. 1 is an exploded perspective view showing a schematic configuration of a recording head according to a first embodiment of the present invention.
Figure 2A:
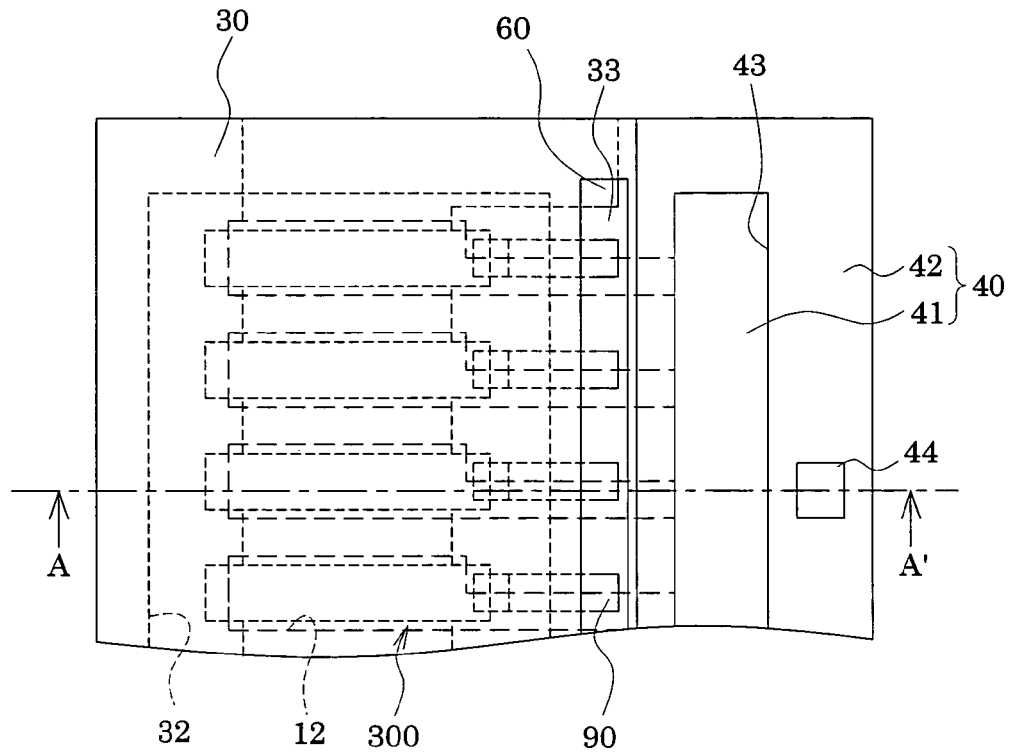
FIGS. 2A and 2B are respectively a plan and a cross-sectional views of the recording head according to the first embodiment of the present invention.
Figure 2B:
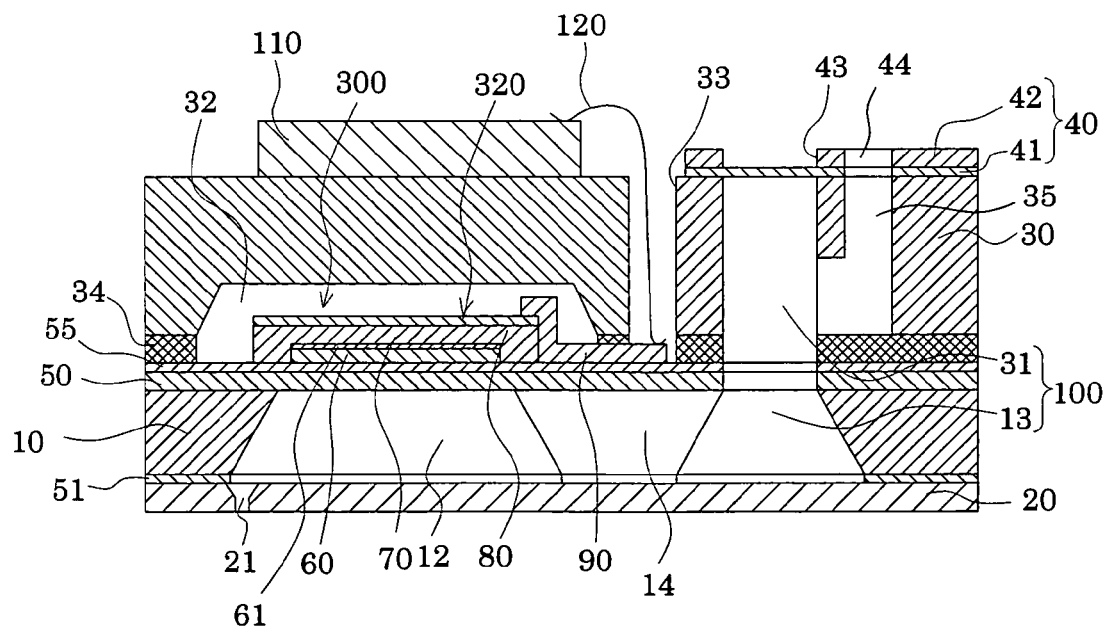

FIG. 1 is an exploded perspective view of an inkjet recording apparatus according to a first embodiment of the present invention. FIG. 2A is a plan view of the inkjet recording head shown in FIG. 1, and FIG. 2B is a cross-sectional view of the inkjet recording head taken along the A-A' line of FIG. 2A.

In the case of this embodiment, a passage-forming substrate 10 is made of a single crystal silicon substrate, as illustrated. An elastic film 50 is formed on one side surface of the passage-forming substrate 10. The elastic film has a thickness of 0.5 to 2 µm, and is made of silicon dioxide beforehand formed by thermal oxidation.

In the passage-forming substrate 10, a plurality of pressure generating chambers 12 compartmentalized by compartment walls 11 are arranged side-by-side by means of anisotropically etching the passage-forming substrate 10 from the other side. In the outer part of the passage-forming substrate 10 in the longitudinal direction, a communicating portion 13 is formed. The communicating portion 13 constitutes a part of a reservoir 100 which is a common ink chamber for the pressure generation chambers 12. The communicating portion 13 communicates with one end of each of the pressure generating chambers 12 in the longitudinal direction through its ink supply path 14. Each of the ink supply paths 14 is formed with a width narrower than that of the pressure generating chamber 12, and thus keep constant the passage resistance of ink flowing from the communicating portion 13 to the pressure generating chambers 12.

A nozzle plate 20 is fixed to an aperture surface of the passage-forming substrate 10 with an adhesive agent, a thermal adhesive film or the like interposed in between. In the nozzle plate 20, nozzle orifices 21 are drilled. The nozzle orifices 21 communicate respectively with the pressure-generating chambers 12 at sides of the pressure-generating chambers 12 which are opposite to the ink supply paths 14. Incidentally, the nozzle plate 20 is made of glass ceramic or stainless steel or the like with a thickness of 0.01 to 1 mm, for example, and with a linear expansion coefficient of 2.5 to 4.5 [$\times 10^{-6}$/° C.], for example, at a temperature not higher than 300° C. One surface of the nozzle plate 20 entirely covers one surface of the passage-forming substrate 10, and thus plays a role of a reinforcement plate for protecting the single crystal silicon substrate from shocks and external forces. In addition, it does not matter that the nozzle plate 20 is formed of a material having a thermal expansion coefficient almost equal to that of the passage-forming substrate 10. In this case, the heat distortion of the passage-forming substrate 10 and the heat distortion of the nozzle plate 20 are almost similar to each other. For this reason, the passage-forming substrate 10 and the nozzle plate 20 can be easily joined to each other by use of a heat-hardening adhesive agent or the like.

On the other hand, as described above, the elastic film 50 is formed on the other surface of the passage-forming substrate 10 which is the side opposite to the aperture surface. The elastic film 50 has a thickness of, for example, approximately 1.0 µm, and is made of silicon dioxide. An insulation film 55 is formed on this elastic film 50 by laminating the insulation film 55 over this elastic film 50. The insulation film 55 is made of zirconia ($ZrO_2$) and the like, and its thickness is approximately 0.4 μm. Furthermore, a lower electrode film 60, piezoelectric layers 70 and upper electrode films 80 are formed on this insulation film 55 by laminating them over one another by use of the process described below. The lower electrode film 60, one piezoelectric layer 70 and one upper electrode film 80 constitute each of piezoelectric elements 300. The lower electrode film 60 is laminated with a thickness of, for example, approximately 0.1 to 0.5 μm, and includes an iridium oxide ($IrO_2$) layer 61, which essentially contains iridium oxide, in its uppermost layer. Each of the piezoelectric layers 70 is made of lead zirconate titanate (PZT) or the like, and has a thickness of, for example, approximately 1.1 μm. Each of the upper electrodes 80 is made of gold, platinum, iridium or the like, and has a thickness of, for example, of approximately 0.05 μm.

In this regard, the piezoelectric element 300 is a portion including the lower electrode film 60, one piezoelectric layer 70 and one upper electrode film 80. In general, the pie zoelectric element 300 is configured in the following manner. One of the two electrodes of the piezoelectric element 300 is used as a common electrode. The other of the two electrodes of the piezoelectric element 300 and the piezoelectric layer 70 are patterned in each of the pressure generating chambers 12. In a portion constituted of a patterned piezoelectric layer 70 and a corresponding patterned one of the two electrodes, a piezoelectric strain occurs due to application of a voltage to the two electrodes. This portion is called a "piezoelectric active portion" in this regard. In the case of this embodiment, the lower electrode film 60 is used as a common electrode for the piezoelectric elements 300, the upper electrode films 80 are used as individual electrodes of the piezoelectric elements 300. However, it does not matter if the use is the other way around in order to convenience a drive circuit and interconnects. In both cases, the piezoelectric active portions are formed respectively in each of the pressure generating chambers. In addition, a combination of one piezoelectric element 300 and a vibration plate is called a "piezoelectric actuator." The vibration provides a displacement depending on a drive of the piezoelectric element 300. Incidentally, in the aforementioned example, the elastic film 50, the insulation film 55 and the lower electrode film 60 function jointly as the vibration plate.

Moreover, the iridium oxide ($IrO_2$) layer 61 is formed in a part of the lower electrode film 60, which part contacts the piezoelectric layers 70, by means of heating the lower electrode film 60 at the same time as a plurality of piezoelectric films to constitute the piezoelectric layers 70 are heated and baked while the plurality of piezoelectric films are being laminated over one another by use of a manufacturing method, which will be described-in detail. The iridium oxide layer 61 essentially contains iridium oxide, and its thickness limit is 50 nm. Such an iridium oxide layer 61 is formed in the following manner. First, a metal layer essentially containing iridium (Ir) is formed, with a thickness limit of 20 nm, in the uppermost layer of the lower electrode film 60. Then, the metal layer is thermally processed and formed at the same time as the piezoelectric layers 70 are baked and formed. Incidentally, it is desirable that the metal layer in the lower electrode film 60 which has not yet been thermally processed be 5 to 20 nm in thickness. The iridium oxide layer 61 formed by thermally processing such a lower electrode film 60 is 10 to 50 nm.

In addition, the piezoelectric layers 70 are formed on the lower electrode film 60, and are crystal films which are made of a ferroelectric-ceramics material exhibiting an electromechanical transducing effect, and which have a perovskite structure. As a material for the piezoelectric layers 70, for example, a ferroelectric-piezoelectric material and what is obtained by adding a metallic oxide to the ferroelectric-piezoelectric material and the like are desirable. Such a ferroelectric-piezoelectric material includes lead zirconate titanate (PZT). Such a metallic oxide includes niobium oxide, nickel oxide and magnesium oxide. Specifically, lead titanate ($PbTiO_3$), lead zirconate titanate (Pb (Zr, Ti) $O_3$), lead zirconate ($PbZrO_3$), lead lanthanum titanate ((Pb, La), $TiO_3$), lead lanthanum Zirconate titanate ((Pb, La) (Zr, Ti) $O_3$), lead zirconium titanate magnesium niobate (Pb (Zr, Ti) (Mg, Nb) $O_3$) or the like can be used. The piezoelectric layers 70 are formed with a thickness which prevents a crack from occurring in the piezoelectric layers 70 in the manufacturing process, and which enables the piezoelectric layers 70 to exhibit their displacement characteristic sufficiently. In the case of this embodiment, the piezoelectric layers 70 are formed with a thickness of, for example, 1 to 2 μm.

Furthermore, a lead electrode 90 is connected to each of the upper electrode films 80 which are individual electrodes for the respective piezoelectric elements 300. The lead electrode 90 is drawn out from the vicinity of an end of the corresponding ink supply path 14, and is extended to the top of the insulation film 55. The lead electrode 90 is made of, for example, gold or the like.

A protection plate 30 is joined to the top of the passage-forming substrate 10 over which such piezoelectric elements 300 are formed, in other words, above the lower electrode film 60, the elastic film 50 and the lead electrodes 90, with an adhesive agent 34 interposed in between. The protection plate 30 includes a reservoir portion 31 constituting at least a part of a reservoir 100. In the case of this embodiment, this reservoir portion 31 is formed in a way that the reservoir portion 31 penetrates through the protection plate 30 in the thickness direction, and that the reservoir portion 31 extends in a direction which is the same as the width direction of the pressure generating chambers 12. The reservoir portion 31 communicates with the communication portion 13 of the passage-forming substrate 10 as the aforementioned above, and thus constitutes the reservoir 100 which is used as a common ink chamber for the pressure generating chambers 12.

Moreover, a piezoelectric element holding portion 32 is provided to a region of the protection plate 30, which region is opposite to the piezoelectric elements 300. The piezoelectric element holding portion 32 has a cavity large enough for the piezoelectric elements 300 to move without hindrance. It suffices if the protection plate 30 has a cavity large enough for the piezoelectric elements 300 to move without hindrance. It does not matter whether or not the cavity is sealed up.

It is desirable that a material having a thermal expansion coefficient equal to that of the passage forming substrate 10 be used for such a protection plate 30. Examples of the material include glass and ceramics and the like. In the case of this embodiment, the protection plate 30 is formed of a single crystal silicon substrate which is the same material as the passage-forming substrate is formed of.

Furthermore, the protection plate 30 is provided with a through-hole 33 which penetrates through the protection plate 30 in the thickness direction. Moreover, the vicinities of the ends of the lead electrodes 90 drawn out respectively from the piezoelectric elements 300 are set up in a way that the vicinities are exposed to the through-hole 33.

As well, a drive circuit 110 is fixed to the top of the protection substrate 30. The drive circuit 110 drives the piezoelectric elements 300 arranged in the parallel lines. For example, a circuit plate, semiconductor integrated circuit (IC) and the like can be used as this drive circuit 110. Additionally, the drive circuit 110 and each of the lead electrodes 90 are electrically connected with each other through a connecting interconnect 120. The connecting interconnect 120 is made of a conductive wire such as a bonding wire.

In addition, a compliance plate 40 is joined to the top of the protection plate 30. The compliance plate 40 is configured of a sealing film 41 and a fixed plate 42. In this regard, the sealing film 41 is made of a flexible material with a lower rigidity (for example, a polyphenylen sulfide (PPS) film) with a thickness of 6 μm. One end of the reservoir portion 31 is sealed up by this sealing film 41. Furthermore, the fixed plate 42 is formed of a hard material such as a metal (for example, stainless steel (SUS) or the like with a thickness of 30 μm) A region of this fixed plate 42, which region is opposite to the reservoir 100, is an opening portion 43 which is obtained by completely removing the region from the fixed plate 42 in the thickness direction. Accordingly, one end of the reservoir 100 is sealed up only by the sealing film 41 which is flexible.

An ink introducing port 44 for supplying ink to the reservoir 100 with is formed in a part of the compliance plate 40. The part of the compliance 40 is outside of-this reservoir 100, and is situated in a position corresponding roughly to the center of the reservoir 100 in the longitudinal direction. Furthermore, the protection plate is provided with an ink introduction path 35 through which the ink introduction port 44 and a side wall of the reservoir 100 communicate with each other.

Such an inkjet recording head according to this embodiment takes in ink from the ink introducing port 44 connected with external ink supply means, which is not illustrated, and fills the interior ranging from the reservoir 100 through the nozzle orifices 21 with ink. Thereafter, the inkjet recording head applies a voltage between the lower electrode-film 60 and each of the upper electrode films 80 corresponding to the pressure generating chambers 12, in accordance with recording signals from the drive circuit. Thus, the inkjet recording head deforms the elastic film 50, the lower electrode films 60 and the piezoelectric layers 70 with flexure. This deformation raises the pressure in each of the pressure generating chambers 12, and thereby ink droplets are ejected from the nozzle orifices 21.

Figure 3A:
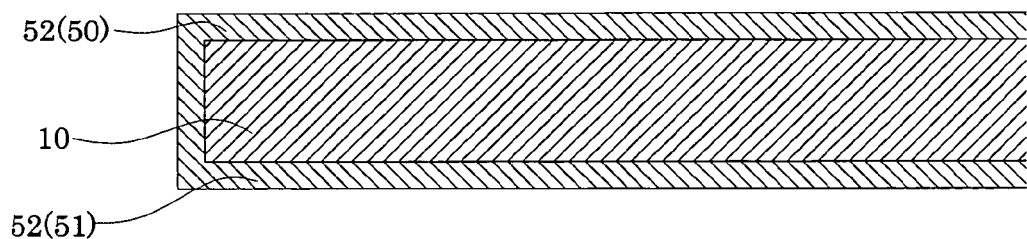
FIGS. 3A to 3C are cross-sectional views showing a method of manufacturing the recording head according to the first embodiment of the present invention.
Figure 3B:
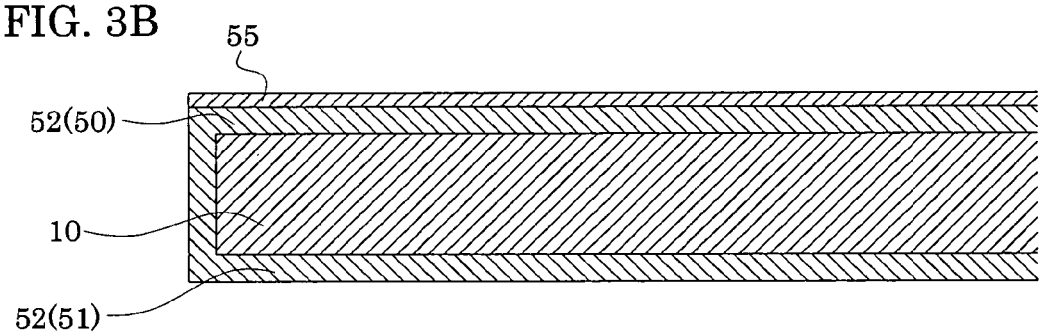

Hereinafter, descriptions will be provided for a method of manufacturing such an inkjet recording head with reference to FIGS. 3 to 8. It should be noted that FIGS. 3 to 6 are cross-sectional views of the pressure generating substrate 12 in the longitudinal direction. FIGS. 7 to 8 are cross-sectional views of a main part of the lower electrode film. First of all, as shown in FIG. 3A, the passage-forming substrate 10 made of a single crystal silicon substrate is thermally oxidized in a diffusion furnace at approximately 1100° C. Thereby, a silicon dioxide 52, which will be later turned into the elastic film 50 and a protection film 51, is formed on the surface of the passage-forming substrate 10. Subsequently, as shown in FIG. 3B, a zirconium (Zr) layer is formed on top of the elastic film 50 (the silicon dioxide film 52). Thereafter, the insulation layer 55 made of zirconia is formed by means of thermally oxidizing the zirconium layer, for example, in the diffusion furnace at 500 to 1200° C.

Figure 3C:
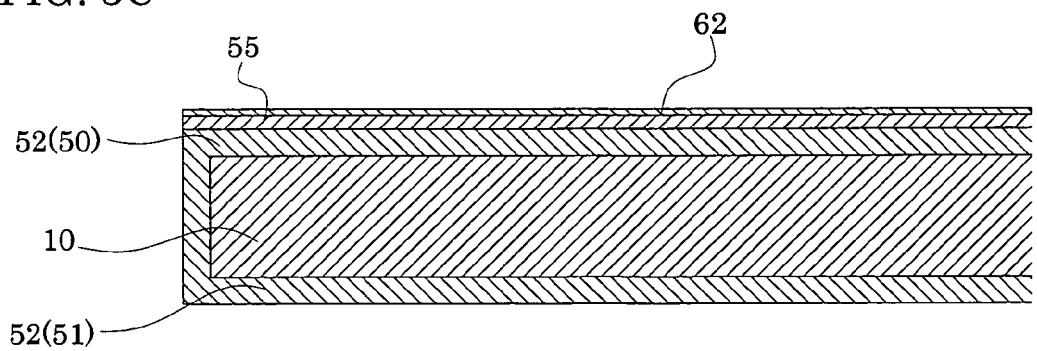
Figure 4A:
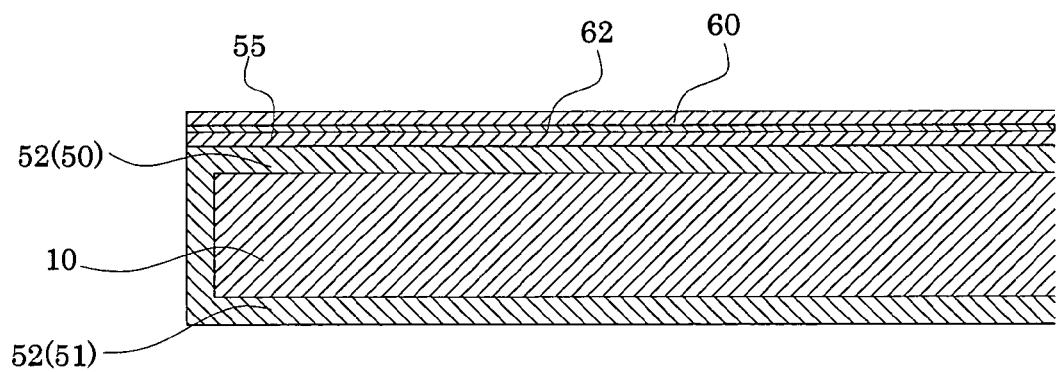
FIGS. 4A to 4C are cross-sectional views showing the method of manufacturing the recording head according to the first embodiment of the present invention.
Figure 4B:
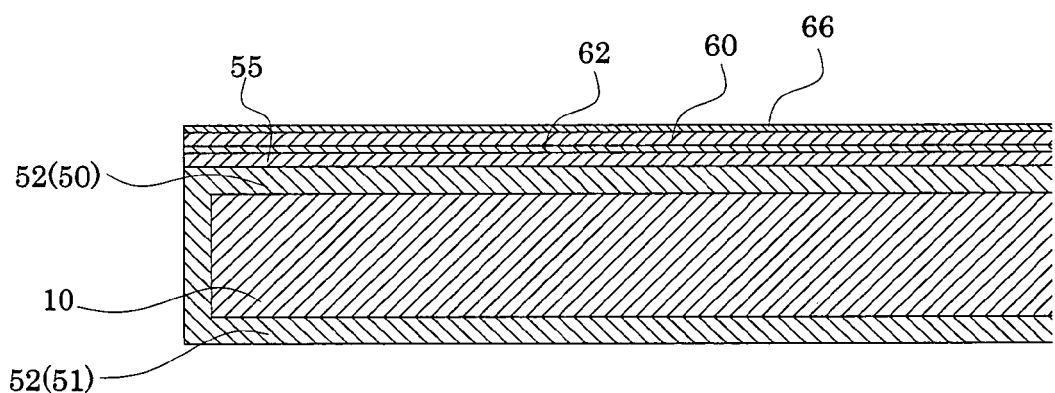
Figure 7A:
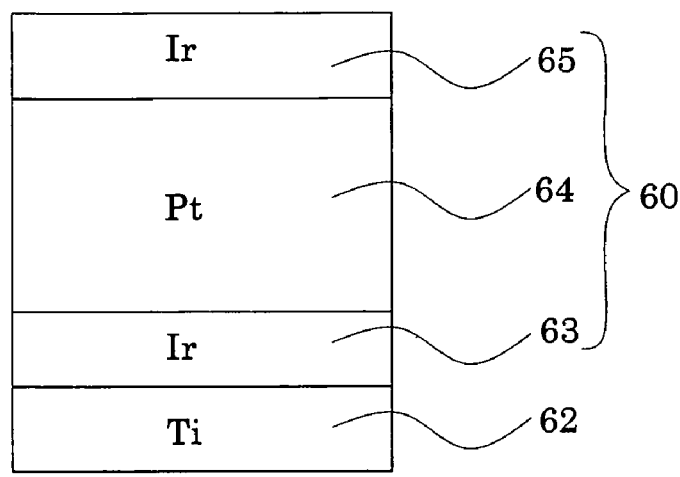
FIGS. 7A to 7B are cross-sectional views of a main part of a lower electrode film, which show a manufacturing method according to the first embodiment of the present invention.

Subsequently, the lower electrode film 60 is formed. Specifically, first of all, as shown in FIG. 3C, an adhesion layer 62 is formed on top of the insulation layer 55. A layer with a thickness of 10 to 50 nm which essentially contains at least one element selected from a group of titanium (Ti) and chromium (Cr) can be cited as this adhesion layer 62. Provision of this adhesion layer 62 can increase the adhesion between the insulation layer 55 and the lower electrode film 60. Then, as shown in FIG. 7A, an iridium layer 63, a platinum layer 64 and a metal layer 65 are laminated over one another on top of the adhesion layer 62. The iridium layer 63 is made of iridium (Ir), and its thickness is 20 nm. The platinum layer 64 is made of platinum, and its thickness is 60 nm. The metal layer 65 is made of iridium (Ir), and its thickness is 20 nm. Thereby, the lower electrode film 60 is formed on top of the adhesion layer 62, as shown in FIG. 4A. Next, as shown in FIG. 4B, a seed layer 66 is formed on top of the lower electrode film 60. The seed layer 66 is made of titanium (Ti), and its thickness is 1 to 20 nm. In the case of this embodiment, its thickness is 4.5 nm. Provision of the seed layer 66 on top of the lower electrode film 60 makes it possible to control the priority orientation of the piezoelectric layer 70 in order that the priority orientation can be (100) or (111) while the piezoelectric layer 70 is being formed above the lower electrode film 60 with the seed layer 66 interposed in between in the following step. This makes it possible to obtain the piezoelectric layer 70, which is suitable as an electromechanical transducing element. Incidentally, the material for the seed layer 66 is not limited to titanium (Ti). Materials containing at least titanium (Ti), such as titanium oxide and lead titanate, can be used for the seed layer 66. An intermediate product, such as lead titanate, is produced from the seed layer 66, while the piezoelectric layer 70 is being formed by baking. Thus, the seed layer 66 helps the piezoelectric layer 70 to be crystallized, and helps to obtain satisfactory crystals. After baking, the seed layer 66 is diffused into the piezoelectric layer 70.

Figure 4C:
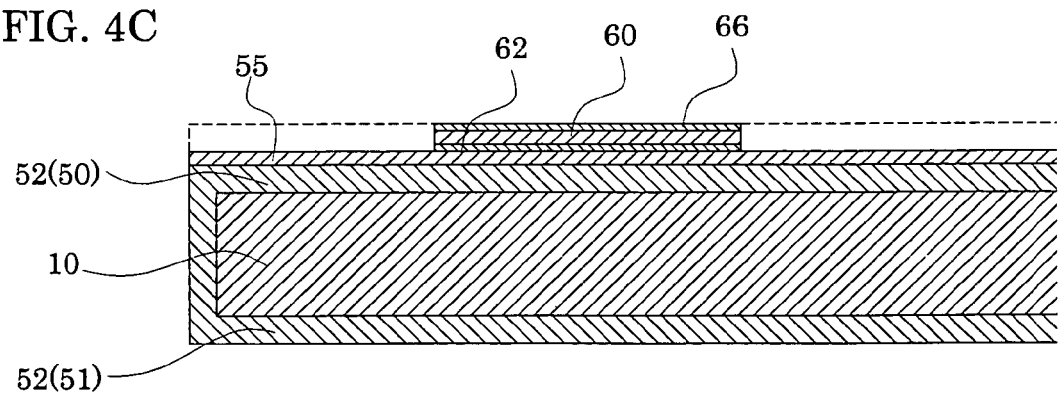

It should be noted that such an adhesion film 62, the layers 63 to 65 of the lower electrode film 60, and the seed layer 66 can be formed by the DC magnetron sputtering method. In addition, it is desirable that at least the layers 64 to 65 of the lower electrode film 60 and the seed layer 66 be continuously formed without releasing these layers from the vacuum condition in the sputtering system. Specifically, continuous formation of the layers of the lower electrode film 60, which are relatively easily detached from each other, increases the adhesiveness of the layer. After the adhesion layer 62, the layers 63 to 65 constituting the lower electrode film 60, and the seed layer 65 are formed, the lower electrode layer 60 is formed by patterning, as shown in FIG. 4C.

Subsequently, the piezoelectric layer 70 made of lead zirconate titanate (PZT) is formed. In this respect, in the case of this embodiment, the piezoelectric layer 70 is formed by use of what is termed as the sol-gel method. In accordance with the sol-gel method, what is termed as sol is obtained by dissolving and dispersing an metal-organic substance in a catalytic agent. This sol is turned into gel by applying and drying. Then, the gel is baked at a higher temperature. Thereby, the piezoelectric layer 70 made of a metal-oxide substance is obtained. Incidentally, the material for the piezoelectric layer 70 is not limited to lead zirconate titanate. It does not matter whether another piezoelectric material, for example, a relaxor ferroelectric (e.g. PMN-PT, PZN-PT, PNN-PT or the like) is used. In addition, the method of manufacturing the piezoelectric layer 70 is not limited to the sol-gel method. It does not matter whether, for example, the MOD (Metal-Organic Deposition) method or the like is used.

Figure 5A:
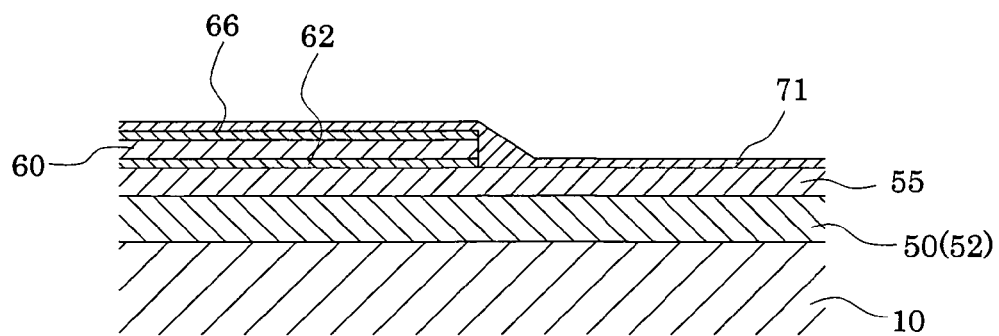
FIGS. 5A to 5C are cross-sectional views showing the method of manufacturing the recording head according to the first embodiment of the present invention.

A specific procedure of forming the piezoelectric layer 70 is as follows. As shown in FIG. 5A, first of all, a piezoelectric precursor film 71 which is a PZT precursor film is formed on top of the lower electrode film 60. In other words, the sol (liquid solution) containing the metal-organic substance is applied to the top of the lower electrode film 60 which has been formed above the passage-forming substrate 10 (in the applying step). Subsequently, this piezoelectric precursor film 71 is heated at a predetermined temperature, and thus is dried for a certain length of time. In the case of this embodiment, the piezoelectric precursor film 71 can be dried, for example, by means of keeping the piezoelectric precursor film 71 at 170-180° C. for 8 to 30 minutes. Furthermore, it is desirable that the rate of temperature rise in the drying step be 0.5 to 1.5° C./sec. Incidentally, the "rate of temperature rise," which has been referred to in this respect, is defined as a rate of change of temperature from Temperature 1 through Temperature 2 with respect to time. Temperatures 1 and 2 are calculated in the following manner. To begin with, the difference between a temperature (room temperature), at which the heating is started, and a temperature which the piezoelectric precursor film 71 reaches by the heating is obtained. Then, Temperature 1 is obtained by adding 20% of the difference to the temperature at which the heating is started. Temperature 2 is obtained by adding 80% of the difference to the temperature at which the heating is started. In a case where, for example, the temperature is raised from room temperature (25° C.) to 100° C. in 50 seconds, the rate of temperature rise is as follows.

$$(100-25)\times(0.8-0.2)/50=0.9 \text{ [° C./sec]}$$

Subsequently, the piezoelectric precursor film 71, which has been dried, is degreased by means of heating the piezoelectric precursor film 71 up to a predetermined temperature and keeping the film at that temperature for a certain length of time. In the case of this embodiment, the piezoelectric precursor film 71 is degreased, for example, by means that of heating the film up to a temperature of approximately 300 to 400° C. and keeping the film at the temperature for approximately 10 to 30 minutes. Incidentally, the degreasing, which has been referred to in this respect, means that organic components contained in the piezoelectric precursor film 71 are eliminated therefrom, for example, as $NO_2$, $CO_2$, $H_2O$ and the like. In the degreasing step, it is desirable that the rate of temperature rise be 0.5 to 1.5° C./sec.

Then, the piezoelectric precursor film 71 is heated up to a predetermined temperature, and is kept at the temperature for a certain length of time, and thus is crystallized. Accordingly, a piezoelectric film 72 is formed (in the baking step). In the baking step, it is desirable that the piezoelectric precursor film 71 be heated up to a temperature of 680 to 900° C. In the case of this embodiment, the piezoelectric precursor film 71 is baked by means of heating the piezoelectric precursor film 71 at 680° C. for 5 to 30 minutes, and thus the piezoelectric layer 72 is formed. Moreover, in the baking step, it is desirable that the rate of temperature rise is 15° C./sec.

It should be noted that, for example, an RTP (rapid thermal processing) system can be used as the heating system used for the drying, degreasing and baking steps. The RTP system performs the thermal process by means of irradiation from a hot plate or an infrared lamp.

Then, the piezoelectric-layer forming step including the aforementioned applying, drying, degreasing and baking steps is repeated a plurality of times. In the case of this embodiment, the piezoelectric-layer forming step is repeated ten times. Thus, the piezo electric layer 70 with a predetermined thickness, including ten piezoelectric films 72, is formed as shown in FIG. 5C. In a case where the thickness of the sol which is applied each time is approximately 0.1 μm, the total film thickness of the piezoelectric film 70 is approximately 1.1 μm.

The lower electrode film 60 is also baked at the same time as the piezoelectric film forming step, particularly the baking step, is being performed. By this, the metal layer 65 is thermally processed, and thus the iridium oxide layer 61 is formed in a part of the lower electrode film 60, which part is the closest to the piezoelectric layers 70. Incidentally, in the case of this embodiment, the pre-heated metal layer 65 is 5 to 10 nm in thickness. As a result, by thermal oxidation of this metal layer 65, the iridium oxide layer 61 with a thickness of approximately 2.5 times that of the preheated metal layer 65 is formed. In other words, the iridium oxide layer 61 with a thickness of 10 to 50 nm is formed.

Figure 7B:
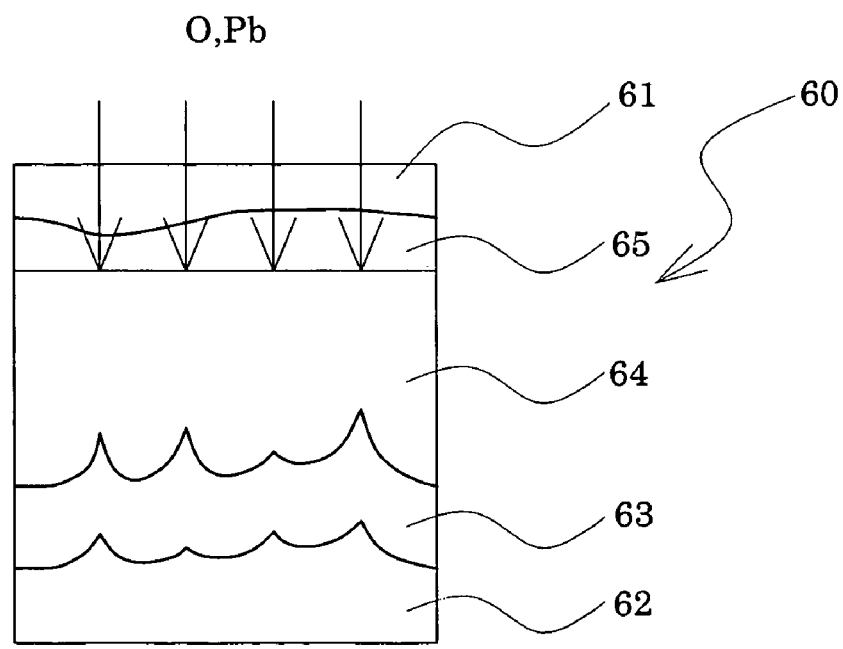
Figure 8A:
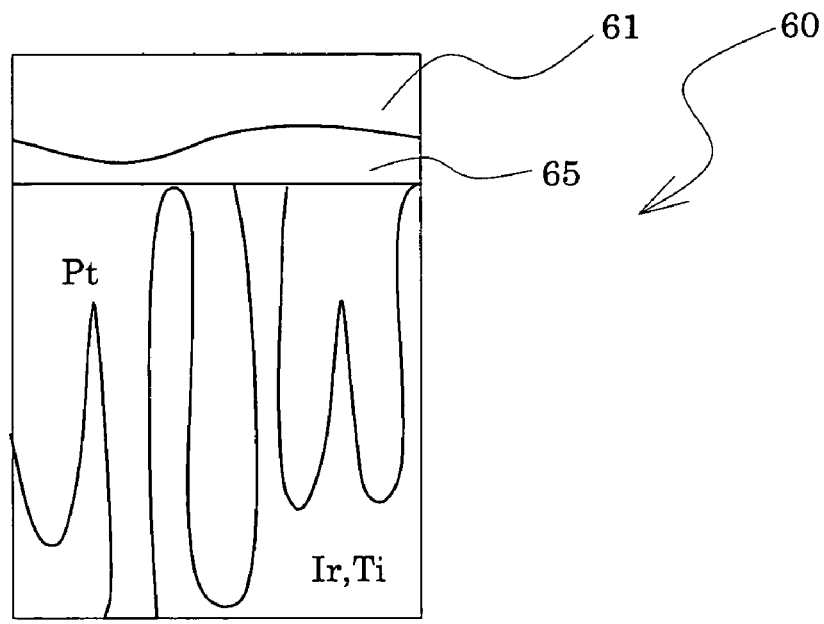
FIGS. 8A to 8B are cross-sectional views of the main part of the lower electrode film, which show the manufacturing method according to the first embodiment of the present invention.

In this regard, detailed descriptions will be provided for the lower electrode film 60 which is obtained through the piezoelectric film forming step. As shown in FIG. 7A, first of all, the lower electrode film 60 including the iridium layer 63, the platinum layer 64 and the metal layer 65 is formed on top of the adhesion 62 by laminating the iridium layer 63, the platinum layer 64 and the metal layer 65 over one another as shown in FIG. 7A. When the first piezoelectric film 72 is formed on the lower electrode film 60 by baking, lead (Pb) and oxygen (O) of the piezoelectric film 72 is diffused into the lower electrode film 60, as shown in FIG. 7B. By this, a portion of the metal film 65 is oxidized, and thus the iridium oxide layer 61 is formed in a part of the metal film 65, which part is closest to the piezoelectric film 72. Concurrently, the adhesion layer 62 is diffused into the interface between the insulation film 55 and the lower electrode film 60, and the interface between the metal layer 65 and the platinum layer 64. Furthermore, the lower electrode film 60 is heated repeatedly, while the piezoelectric films 72 are being laminated over one another repeatedly. At this time, the adhesion layer 62 and the iridium layer 63 ascend along the grain boundaries of the platinum layer 64, as shown in FIG. 8A. In addition, the metal layer 65 is pushed down, and descends to the interface between the insulation film 55 and the lower electrode film 60, as shown in FIG. 8A. Moreover, the lower electrode film 60 is further heated repeatedly, while the piezoelectric films 72 are being laminated over one another repeatedly. At this time, iridium from the metal layer 65 and iridium from the iridium layer 63 move to a part of the lower electrode film 60, which part is closest to the piezoelectric layer 70. In addition, the resultant iridium is heated, and thus is thermally processed. As a result, the iridium oxide layer 61 made of the iridium oxide is formed. Additionally, a mixture obtained by mixing the titanium of the adhesion layer 62, a part of the iridium of the iridium layer 63, the platinum of the platinum layer 64, and the lead and oxygen diffused from the adhesion layer 62 is formed underneath the iridium oxide layer 61.

The formation of the iridium oxide layer 61 in the part of the lower electrode film 60, which part is closest to the piezoelectric layer 70, in this manner makes it possible to prevent oxygen from getting out of the piezoelectric layers 72. Accordingly, this makes it possible to prevent the characteristics of the piezoelectric layers 72 from deteriorating. Incidentally, in a case where the thickness of the metal layer 65 is larger than 20 nm while such a piezoelectric layer 70 is being formed, an inter-layer detachment occurs between the metal layer 65 and the iridium oxide layer 61 while the metal layer 65 and the iridium oxide layer 61 are in a condition as shown in FIG. 8A. In the case of this embodiment, the provision of the following metal layer 65 makes it possible to securely prevent the inter-layer detachment in the lower electrode film 60. The metal layer 65 is provided in the uppermost layer of the lower electrode film 60 which is obtained before the piezoelectric film 72 is baked, and the limit of the thickness of the metal layer 65 is 20 nm. Additionally, the metal layer 65 essentially contains iridium (Ir). Specifically, it is at a time of the transitional condition as shown in FIG. 8B when the inter-layer detachment occurs in the lower electrode film 60.

Figure 8B:
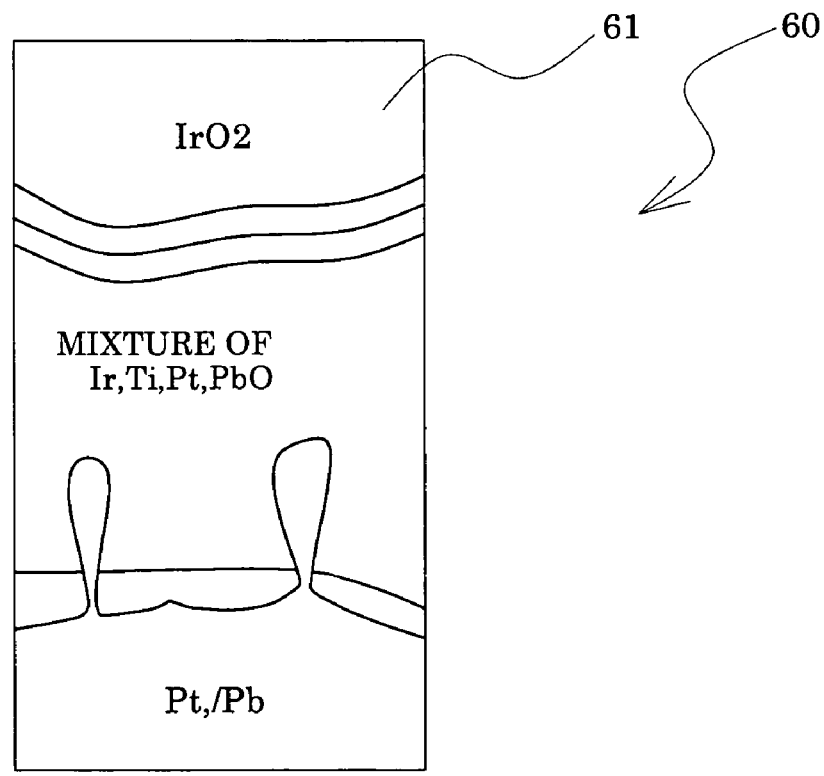

After the metal layer 65 comes into the condition as shown in FIG. 8B, the inter-layer detachment does not occur.

Figure 5B:
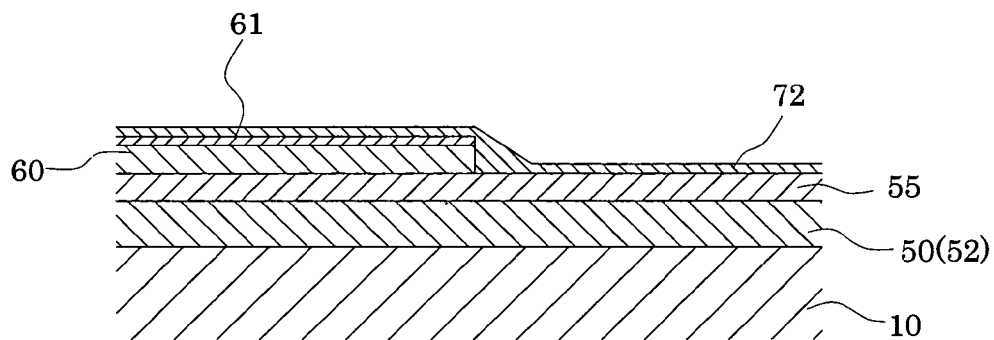
Figure 5C:
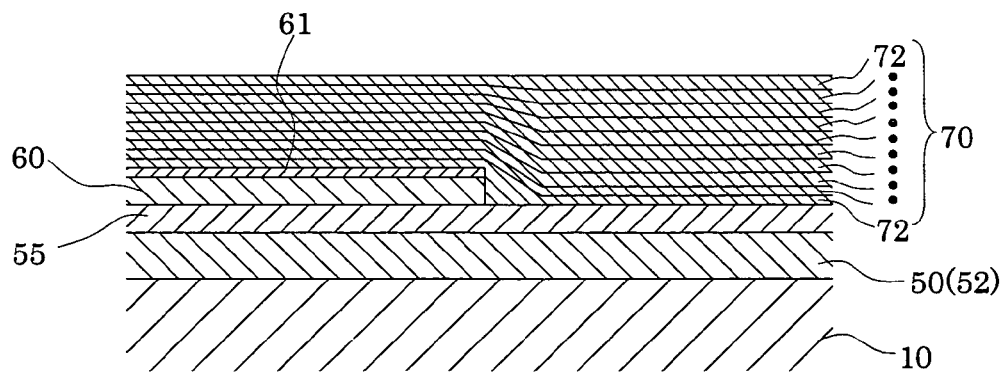
Figure 6A:
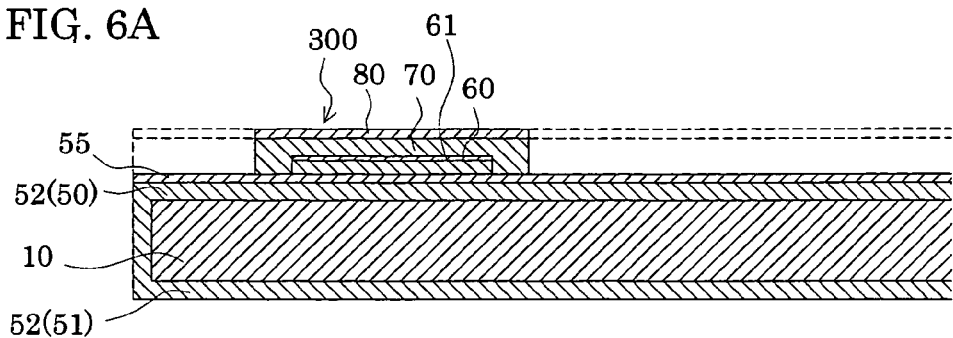
FIGS. 6A to 6D are cross-sectional views showing the method of manufacturing the recording head according to the first embodiment of the present invention.
Figure 6B:
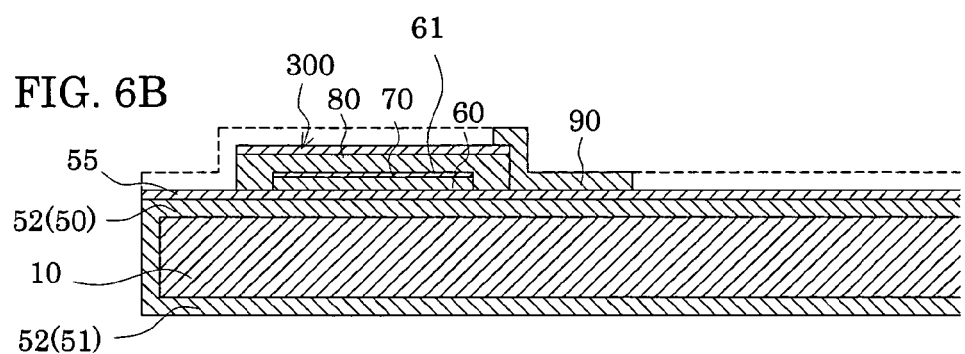

In addition, after the piezoelectric layer 70 is formed through the steps as shown in FIGS. 5A to 5C, the upper electrode film 80 is formed above the entire surface of the passage-forming substrate 10, as shown in FIG. 6A. The upper electrode film 80 is made, for example of iridium. Then, the piezoelectric layer 70 and the upper electrode film 80 are patterned in each of the regions respectively opposite to the pressure generating chambers 12. Thus, the piezoelectric elements 300 are formed. Subsequently, the lead electrodes 90 are formed. Specifically, the lead electrodes 90 are formed in the following manner. First, a lead electrode 90 is formed above the entire surface of the passage-forming substrate 10 as shown in FIG. 6B. The lead electrode 90 is made, for example, of gold (Au) and the like. Thereafter, the lead electrode 90 is patterned in each of the piezoelectric elements 300 by use of a mask pattern (not illustrated) made, for example, of a resist or the like.

Figure 6C:
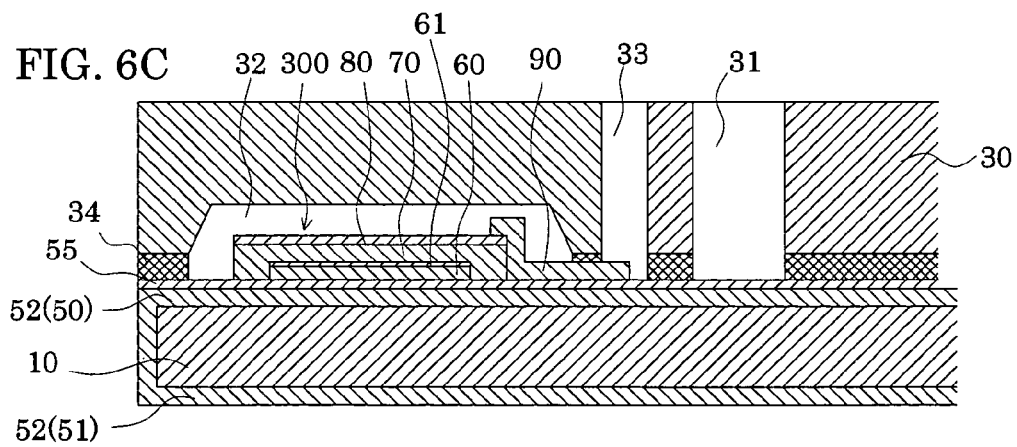

Next, the protection plate 30 is joined to the top of the passage-forming substrate 10, for example, with the adhesive agent 34, as shown in FIG. 6C. The protection plate 30 hold the plurality of piezoelectric elements 300 thus patterned. Incidentally, the reservoir portion 31, the piezoelectric element holing portion 32 and the like are beforehand formed in the protection plate 30. In addition, the protection plate 30 is made, for example, of a single crystal silicon substrate having a thickness of approximately 400 μm. The joining of the protection plate 30 to the passage-forming substrate 10 remarkably increases the rigidity of the resultant passage-forming substrate 10.

Figure 6D:
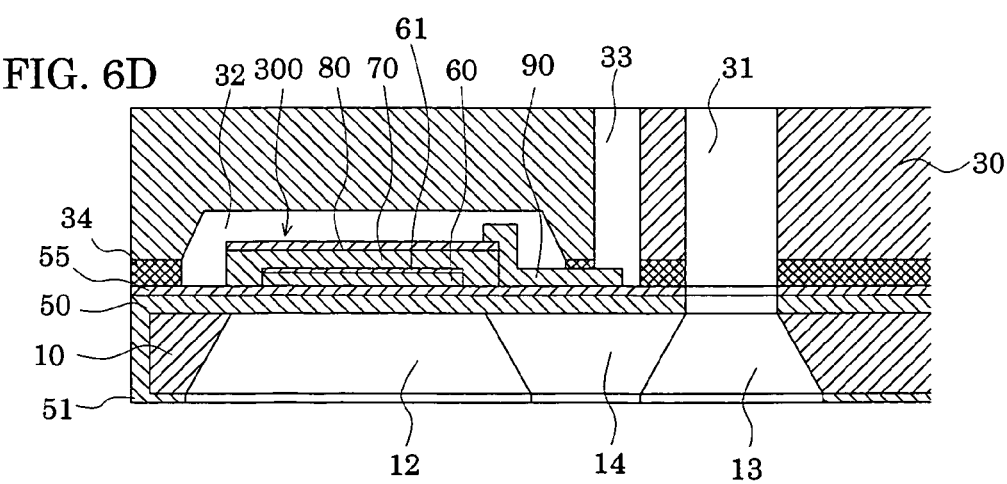

Subsequently, as shown in FIG. 6D, the protection film 51 is formed by means of patterning the silicon dioxide 52 on a surface of the passage-forming substrate 10, into a predetermined shape, the surface being opposite to the surface above which the piezoelectric elements 300 are formed. With the protection film 51 used as a mask, the passage-forming substrate 10 is caused to undergo an anisotropic etching (wet-etching) by use of an alkaline solution such as KOH. Thereby, the pressure-forming chambers 12, the communicating portion 13, the ink supply paths 14 and the like 14 are formed in the passage-forming substrate 10.

Subsequently, the nozzle plate 20 is joined to a surface of the passage-forming substrate 10, which surface is opposite to the surface to which the protection plate 30 has been joined. The nozzle orifices 21 are drilled in the nozzle plate 20. Concurrently, the compliance plate 40 is joined to the protection plate 30. Thereby, the inkjet recording head as shown in FIG. 1 is formed.

It should be noted that a large number of chips are actually formed on a single wafer at a time through the aforementioned series of film formations and anisotropic etchings. After the process is completed, the wafer is divided into passage-forming substrates 10 each in a chip size as shown in FIG. 1. Thus, the inkjet recording heads are formed.

First Example

An elastic film made of silicon dioxide ($SiO_2$) was formed by means of thermally oxidizing a passage-forming substrate made of a single crystal silicon substrate by use of the same manufacturing method as is used in the case of the first embodiment which has been described above. Then, an insulation film made of zirconia ($ZrO_2$) was formed on top of this elastic film. Thereafter, a 20-nm-thick adhesion layer made of titanium (Ti) was formed on top of the insulation layer. Subsequently, an iridium layer, a platinum layer and a metal layer are formed, as layers constituting the lower electrode film, while the iridium layer, the platinum layer and the metal layer were sequentially laminated over one another on top of this adhesion layer. The iridium layer was 20 nm in thickness, and was made of iridium (Ir). The platinum layer was 60 nm in thickness, and was made of platinum (Pt). The metal layer was 10 nm in thickness, and was made of iridium (Ir). In addition, a 4.5-nm-thick seed layer made of titanium (Ti) was formed on top of the metal film. Incidentally, such an adhesion layer, such layers of the lower electrode film and such a seed layer were continuously formed without these layers being released from the vacuum condition in the sputtering system by use of the DC magnetron sputtering method.

Second Example

A lower electrode film according to the second example was formed by use of the same configuration and manufacturing method as are used in the case of the first embodiment, which has been described above, except that the thickness of the metal layer made if iridium was 20 nm.

First Comparative Example

A lower electrode film according to the first comparative example was formed by use of the same configuration and manufacturing method as are used in the case of the first embodiment, which has been described above, except that the thickness of the metal layer made if iridium was 30 nm.

Experimental Example

A piezoelectric layer and an upper electrode film were formed on top of each of the lower electrode films respectively formed in the cases of the first and second examples as well as the aforementioned the first comparative example. Specifically, lead zirconate titanate (PZT), which would later become a piezoelectric layer, was applied to each of the lower electrode films by use of the MOD method. Then, the lead zirconate titanate (PZT) on top of each of the lower electrode films was caused to undergo a drying process at 180° C. for 10 minutes. Thereafter, the resultant lead zirconate titanate (PZT) on top of each of the lower electrode films was caused to undergo a degreasing process at 400° C. for 10 minutes. Subsequently, the resultant lead zirconate titanate (PZT) on top of each of the lower electrode films was caused to undergo a baking process at 700° C. for 30 minutes. This piezoelectric film forming step was repeated, and thus a piezoelectric layer including ten piezoelectric films was formed on top of each of the lower electrode films. A total thickness of the piezoelectric layer on top of each of the lower electrode films was 1.1 μm. After the sixth piezoelectric film was formed on top of each of the lower electrode films while the piezoelectric layer was being formed in this manner, the adhesion was measured by use of a scratch tester of very thin films (a CSR02 model made by Rhesca Corporation). Table 1 shows the result of this measurement. Incidentally, the reason why the sixth piezoelectric film was assessed for each of the lower electrode films is that the conditions as shown in FIG. 8A appeared after the sixth film was baked. In addition, the number of films which had been formed when the adhesion was the weakest in each of the lower electrode films varied depending on baking temperatures and baking time lengths.

TABLE 1

| | THICKNESS OF METAL LAYER CLOSEST TO PZT | ADHESION |
| --- | --- | --- |
| EXAMPLE 1 | 10 nm | 66.7 mN |
| EXAMPLE 2 | 20 nm | 52.5 mN |
| COMPARATIVE EXAMPLE 1 | 30 nm | 12.3 mN |

As shown in Table 1, the followings were found. In a case where the piezoelectric layer was formed on top of each of the lower electrode films of the first and the second examples in which the respective metal layers had been formed with a thickness not larger than 20 nm, the adhesion was strong, and no inter-layer detachment occurred in the lower electrode film. However, in a case where the piezoelectric layer was formed on top of the lower electrode film of the first comparative example in which the metal layer had been formed with the thickness of 30 nm, the adhesion was weak, and an inter-layer detachment occurred in the lower electrode film. In addition, in the case of the first comparative example, it was in the lower electrode film where the detachment occurred. By contrast, in the cases of the first and the second examples, it was in the interface between the lower electrode film and the insulation film made of zirconia where an inter-layer detachment occurred.

For this reason, if the thickness of the metal layer to be formed in the uppermost layer of the lower electrode film is not larger than 20 nm, this makes it possible to increase the adhesion between each of the two neighboring layers in the lower electrode film, and accordingly to securely prevent a detachment between each of the two neighboring layers in the lower electrode film which would otherwise occur.

Other Embodiments

The first embodiment of the present invention has been described above. However, the basic configuration of the inkjet recording head is not limited to the aforementioned configuration. In the case of the first embodiment, which has been described above, for example, after the piezoelectric precursor film 71 is applied, dried and degreased, the piezoelectric precursor film 71 is baked, and thus the piezoelectric film 72 is formed. However, the method of fabricating a piezoelectric layer 72 is not limited to this. It does not matter if the piezoelectric film 72 is formed in the following manner. First, processes of applying, drying and degreasing a piezoelectric precursor film 71 are repeated several times, for example, twice. Thereafter, the piezoelectric precursor film 71 is baked. Thereby, the piezoelectric film 72 is formed.

Furthermore, if the following condition is satisfied, a similar effect can be obtained by means of forming the metal layer essentially containing iridium in the uppermost layer of the lower electrode film with a thickness not larger than 20 nm, even in the case where a plurality of piezoelectric films are intended to be laminated over one another. The condition is that desired piezoelectric films can be secured by means of lowering the baking temperature and shortening the baking time before the piezoelectric films are turned into the condition as shown in FIG. 8A, which has been described with regard to the first embodiment.

Moreover, in the case of the first embodiment, which has been described above, the lower electrode film 60 is formed by patterning, and thereafter the piezoelectric layers 70 are formed. However, it does not matter whether the following sequence is used due to devices. A lower electrode film is formed on the entire surface of the passage-forming substrate 10 without patterning the lower electrode film. Thereafter, the first piezoelectric film 72 is formed. Subsequently, the lower electrode film is patterned.

Figure 9:
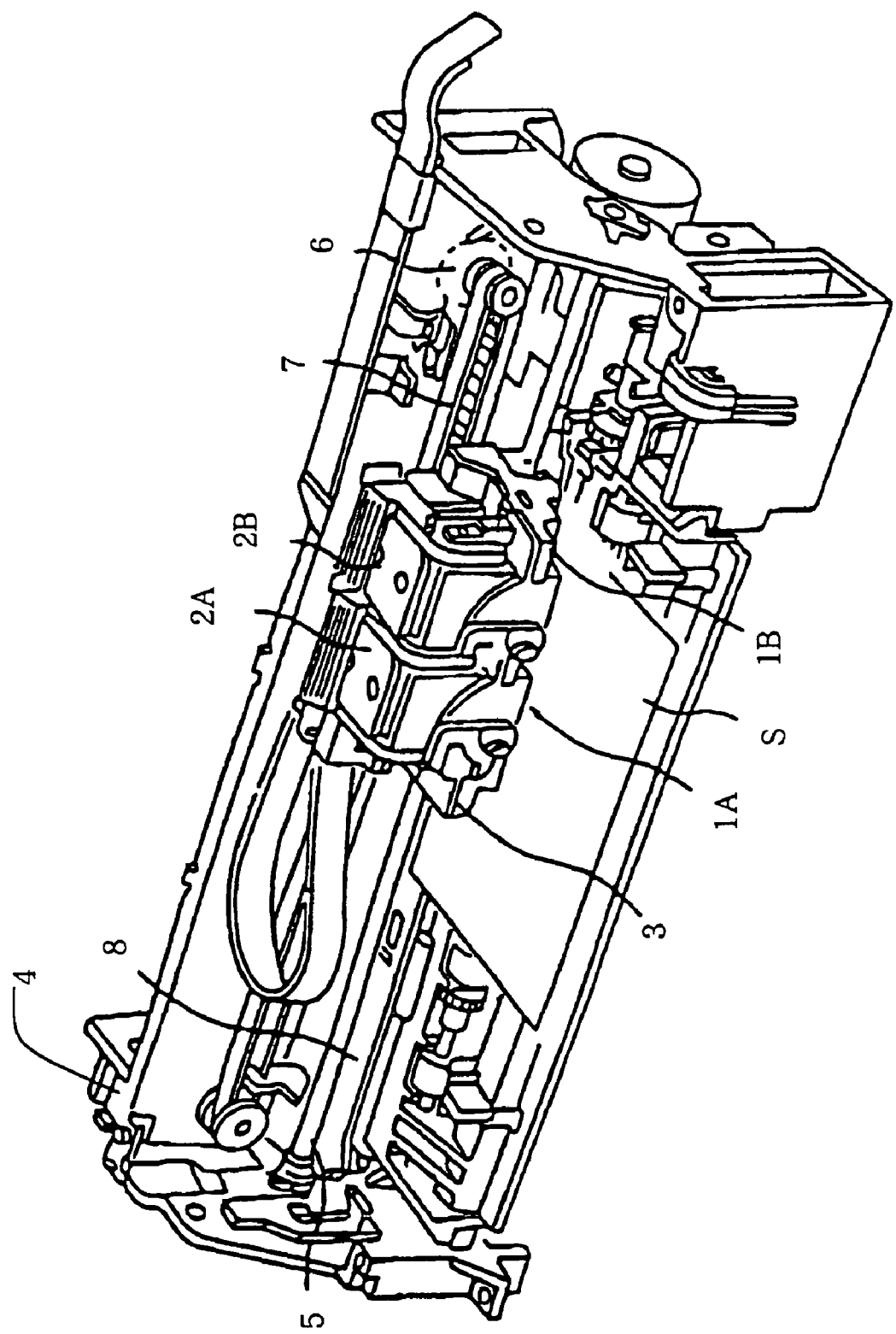
FIG. 9 is a diagram showing a schematic configuration of a recording apparatus according to an embodiment of the present invention.

In addition, the inkjet recording head according to each of those embodiments constitutes a part of a recording head unit provided with an ink passage communicating with an ink cartridge and the like, and is installed in an inkjet recording apparatus. FIG. 9 is a schematic diagram showing an example of the inkjet recording apparatus.

As shown in FIG. 9, recording head units 1A and 1B including the respective inkjet recording heads are detachably provided to cartridges 2A and 2B constituting ink supply means. A carriage 3 on which the recording head units 1A and 1B are mounted is provided to a carriage shaft 5 fixed to the apparatus main body 4 in a way that the carriage 3 can be freely moved in the direction in which the shaft extends. These recording head units 1A and 1B are assigned to ejecting black ink compositions and color ink compositions respectively.

In addition, a drive power from a drive motor is transmitted to the carriage 3 though a plurality of gears, which are not illustrated, and a timing belt 7. Thereby, the carriage 3 on which the recording head unit 1A and 1B are mounted is caused to move along the carriage shaft 5. On the other hand, the apparatus main body 4 is provided with a platen 8 along the carriage shaft 5. A recording sheet S, which is a recording medium such as a sheet of paper, and which has been fed by feed rollers and the like, is designed to be transferred on the platen 8, although the feed rollers are not illustrated.

It should be noted that the present invention is intended to be widely applied to the entire range of liquid-jet heads, although the first embodiment has been described giving the inkjet recording head as an example of the liquid-jet heads. It goes without saying that the present invention can be applied to any liquid-jet head which ejects a liquid other than ink. Examples of liquid-jet head which eject a liquid other than ink includes various recording heads used for image recording apparatus such as printers; color-material-jet heads used for manufacturing color filters of liquid crystal display devices and the like; electrode-material-jet heads used for forming electrodes of organic EL display devices, FED (Field Emission Display) devices and the like; bio-organic-substance-jet heads used for manufacturing bio-chips.

What is claimed is:

1. A piezoelectric element, comprising:
a lower electrode comprising a plurality of layers;
a piezoelectric layer; and
an upper electrode,
wherein at least a part of the lower electrode, which is closest to the piezoelectric layer, is an iridium oxide layer, which essentially contains iridium oxide, and whose thickness upper limit is 50 nm,
wherein essential materials respectively constituting at least two layers of the plurality of the layers of the lower electrode are different from each other.

2. A liquid-jet head comprising:
the piezoelectric element according to claim 1, and
a passage-forming substrate which a pressure generating chamber communication with a nozzle orifice is provided.

3. A liquid-jet apparatus comprising the liquid-jet head according to claim 2.

* * * * *